United States Patent
Jeon et al.

(10) Patent No.: US 6,991,990 B1
(45) Date of Patent: Jan. 31, 2006

(54) METHOD FOR FORMING A FIELD EFFECT TRANSISTOR HAVING A HIGH-K GATE DIELECTRIC

(75) Inventors: Joong S Jeon, Cupertino, CA (US); Huicai Zhong, Wappinger Falls, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 37 days.

(21) Appl. No.: 10/899,955

(22) Filed: Jul. 27, 2004

Related U.S. Application Data

(62) Division of application No. 10/618,273, filed on Jul. 11, 2003, now Pat. No. 6,797,572.

(51) Int. Cl.
*H01L 21/8242* (2006.01)
(52) U.S. Cl. .................. 438/287; 438/240; 438/591; 438/785
(58) Field of Classification Search ............... None
See application file for complete search history.

(56) References Cited

U.S. PATENT DOCUMENTS 6,703,277 B1 * 3/2004 Paton et al. ............... 438/287

* cited by examiner

*Primary Examiner*—Luan Thai
(74) *Attorney, Agent, or Firm*—Farjami & Farjami LLP

(57) ABSTRACT

According to one exemplary embodiment, a method for forming a field effect transistor over a substrate comprises a step of forming an interfacial oxide layer over a channel region of the substrate, where the interfacial oxide layer has a first thickness. The interfacial oxide layer can prevent a high-k element from diffusing into the channel region. The method further comprises forming an oxygen-attracting layer over the interfacial oxide layer, where the oxygen-attracting layer prevents the first thickness of the interfacial oxide layer from increasing. The oxygen-attracting layer is formed by forming a metal layer over the interfacial oxide layer, where the metal layer combines with oxygen to form a silicate. The oxygen-attracting layer may be zirconium silicate or hafnium silicate, for example. The method further comprises forming a high-k dielectric layer over the oxygen-attracting layer. The method further comprises forming a gate electrode layer over the high-k dielectric layer.

7 Claims, 4 Drawing Sheets

METHOD FOR FORMING A FIELD EFFECT TRANSISTOR HAVING A HIGH-K GATE DIELECTRIC

This is a divisional of application Ser. No. 10/618,273 filed Jul. 11, 2003, now U.S. Pat. No. 6,797,572.

1. TECHNICAL FIELD

The present invention is generally in the field of semiconductor devices. More particularly, the present invention is in the field of fabrication of field effect transistors.

2. BACKGROUND ART

As field effect transistors ("FET"), such as metal-oxide semiconductor FETs ("MOSFET"), are scaled down in size, semiconductor manufactures have utilized gate dielectrics having a high dielectric constant ("high-k") to improve FET performance and reliability. High-k gate dielectrics are desirable in small feature size technologies since conventional gate dielectrics, such as silicon dioxide ("$SiO_2$"), are too thin and they result in high tunneling current, as well as other problems, which decrease performance and reliability of FETs. High-k dielectrics, such as hafnium oxide ("HfO") and zirconium oxide ("ZrO"), have a dielectric constant equal to approximately 24, while $SiO_2$ has a dielectric constant equal to approximately 4. As a result, the equivalent oxide thickness ("EOT") for HfO and ZrO is approximately ⅙ of the thickness of $SiO_2$. By way of background, "EOT" refers to the thickness of any dielectric scaled by the ratio of its dielectric constant to the dielectric constant of $SiO_2$. Thus, by utilizing high-k gate dielectrics, semiconductor manufactures can achieve FETs having desirably thin gate dielectrics having a thickness that is equivalent to a much greater thickness of $SiO_2$. However, conventional processes for fabricating FETs having high-k gate dielectrics can cause an undesirable increase in interfacial oxide thickness and carrier mobility degradation in the channel region.

In a conventional process for fabricating a FET having a high-k dielectric, a high-k dielectric, such as HfO or ZrO, is formed over a channel region of a silicon substrate. The high-k dielectric comprises a high-k element, such as Hf or Zr, which is combined with oxygen. However, excessive oxygen from the high-k dielectric combines with silicon on the surface of the silicon substrate to form a low-quality interfacial oxide layer between the silicon substrate and the high-k dielectric. The resulting low-quality interfacial oxide layer causes an undesirable increase in thickness of the gate dielectric, which includes the high-k dielectric and the low-quality interfacial oxide layer. Additionally, the high-k element in the high-k gate dielectric can diffuse into the channel region and, thereby, cause undesirable carrier mobility degradation.

Thus, there is a need in the art for a method for fabricating a high-k gate dielectric in a field effect transistor without causing an undesirable increase in gate dielectric thickness or carrier mobility degradation.

SUMMARY

The present invention is directed to method for forming a field effect transistor having a high-k gate dielectric and related structure. The present invention addresses and resolves the need in the art for a method for fabricating a high-k gate dielectric in a field effect transistor without causing an undesirable increase in gate dielectric thickness or carrier mobility degradation.

According to one exemplary embodiment, a method for forming a field effect transistor over a substrate comprises a step of forming an interfacial oxide layer over a channel region of the substrate, where the interfacial oxide layer has a first thickness. The interfacial oxide layer can prevent a high-k element from diffusing into the channel region. The first thickness of the interfacial oxide layer may be, for example, between approximately 4.0 Angstroms and approximately 5.0 Angstroms.

According to this exemplary embodiment, the method further comprises forming an oxygen-attracting layer over the interfacial oxide layer, where the oxygen-attracting layer prevents the first thickness of the interfacial oxide layer from increasing. The oxygen-attracting layer is formed by forming a metal layer over the interfacial oxide layer, where the metal layer combines with oxygen to form a silicate. The oxygen-attracting layer may be zirconium silicate or hafnium silicate and can have a thickness of approximately 5.0 Angstroms, for example. The method further comprises forming a high-k dielectric layer over the oxygen-attracting layer. The high-k dielectric layer may be, for example, hafnium oxide, hafnium silicate, zirconium silicate, or zirconium oxide. The method further comprises forming a gate electrode layer over the high-k dielectric layer. In one embodiment, the invention is a field effect transistor fabricated by utilizing the above-discussed method. Other features and advantages of the present invention will become more readily apparent to those of ordinary skill in the art after reviewing the following detailed description and accompanying drawings.

DETAILED DESCRIPTION OF THE INVENTION

The present invention is directed to method for forming a field effect transistor having a high-k gate dielectric and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
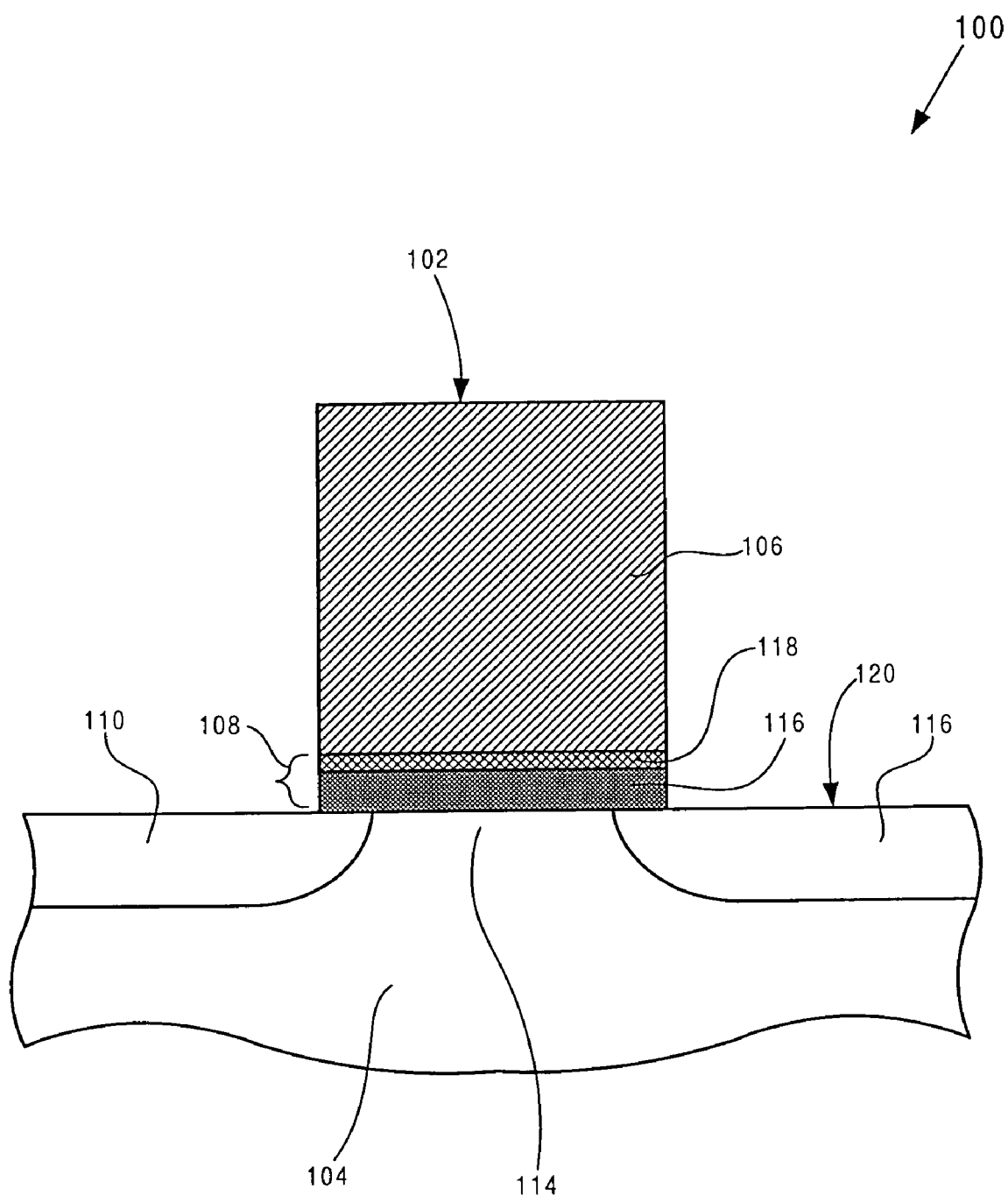
FIG. 1 illustrates a cross-sectional view of a structure including an exemplary field-effect transistor, in accordance with one embodiment of the present invention.

FIG. 1 shows a cross-sectional view of an exemplary structure including an exemplary FET in accordance with one embodiment of the present invention. Structure 100 includes FET 102, which is situated on substrate 104. FET 102 includes gate electrode layer 106, gate dielectric stack 108, source 110, drain 112, and channel region 114. Gate dielectric stack 108 includes high-k dielectric layer 116 and oxygen attracting layer 118. In the present embodiment, FET 102 can be an NFET or a PFET. In one embodiment, FET 102 can be a MOSFET, such as an NMOS or PMOS transistor.

As shown in FIG. 1, source 110 and drain 112, which are formed in a manner known in the art, are situated in substrate 104 and channel region 114 is situated between source 110 and drain 112. Further shown in FIG. 1, high-k dielectric layer 116 is situated over channel region 114 on top surface 120 of substrate 104. High-k dielectric layer 116 can be deposited over substrate 104 utilizing a chemical vapor deposition ("CVD") process or other appropriate processes and can comprise hafnium oxide or zirconium oxide. By way of example, high-k dielectric layer 116 can have a thickness of between approximately 20.0 Angstroms and approximately 30.0 Angstroms.

Also shown in FIG. 1, oxygen-attracting layer 118 is situated over high-k dielectric layer 116 and can comprise hafnium oxide or zirconium oxide. Oxygen-attracting layer 118 can be formed by depositing a metal layer comprising hafnium, zirconium, or other suitable metal over high-k dielectric layer 116 utilizing a CVD process or other appropriate processes. The metal in the metal layer attracts excessive oxygen from high-k dielectric layer 116 such that the metal is converted into a high-k dielectric such as hafnium oxide or zirconium oxide. For example, if the metal layer comprises hafnium or zirconium, the hafnium or zirconium would be converted into hafnium oxide or zirconium oxide, respectively. In one embodiment, oxygen-attracting layer 118 comprises an unconverted portion of metal, such as hafnium or zirconium, and a portion of converted metal comprising hafnium oxide or zirconium oxide, respectively. By way of example, oxygen-attracting layer 118 can have a thickness of approximately 5.0 Angstroms. Further shown in FIG. 1, gate electrode layer 106 is situated over oxygen-attracting layer 118. Gate electrode 106 can comprise polycrystalline silicon or other suitable material, which can be deposited over oxygen-attracting layer 118 utilizing a CVD process or other appropriate processes. By way of example, gate electrode 106 can have a thickness of between 800.0 Angstroms and 2000.0 Angstroms.

By forming oxygen-attracting layer 118 over high-k dielectric layer 116, the present invention advantageously prevents an undesirable low-quality interfacial oxide layer from forming between high-k dielectric layer 116 and substrate 104. As a result, the present invention advantageously achieves a FET, i.e. FET 102, having a high-k gate dielectric stack, i.e. gate dielectric stack 108, where the high-k gate dielectric stack has a desirably low EOT.

Figure 2:
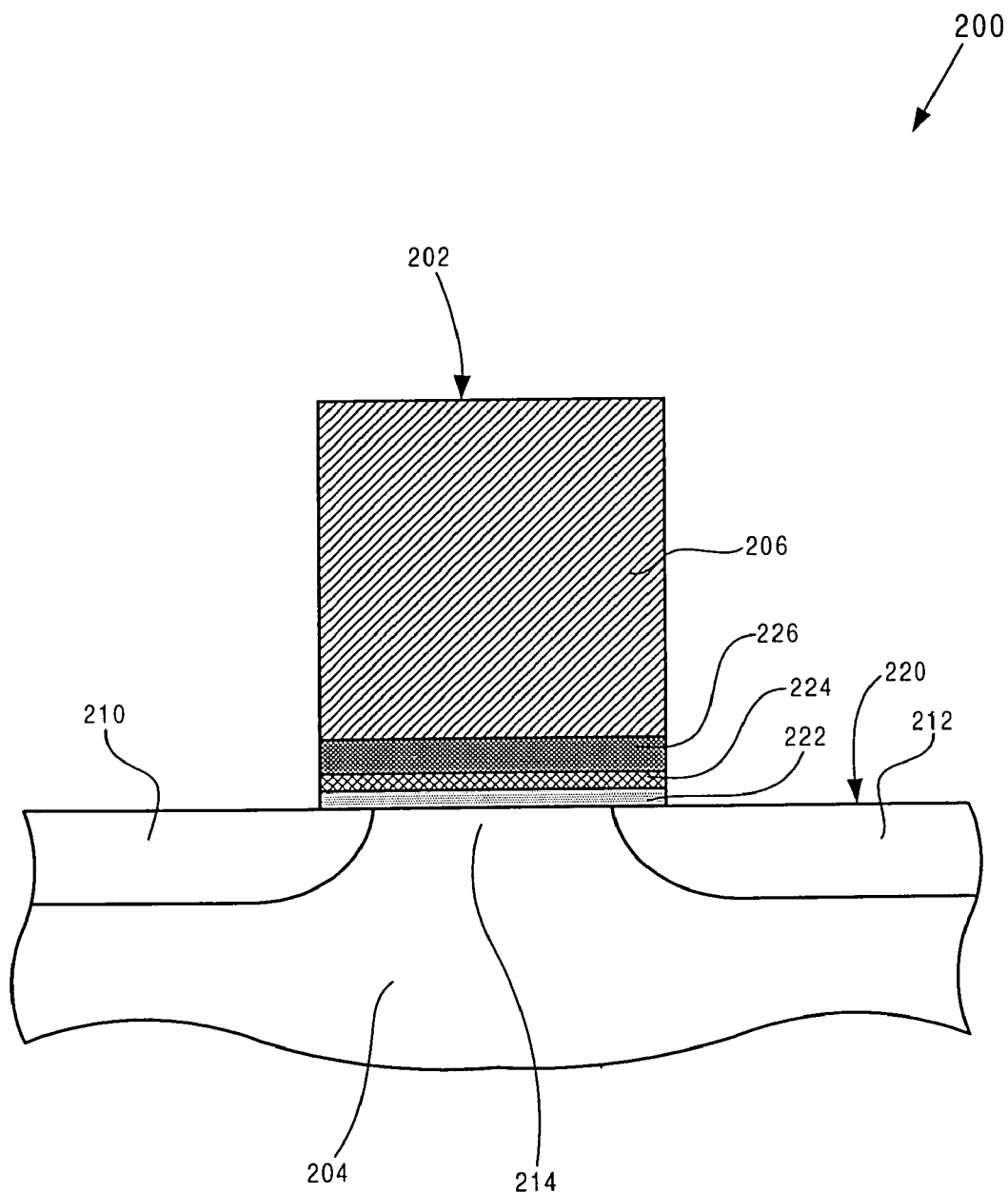
FIG. 2 illustrates a cross-sectional view of a structure including an exemplary field-effect transistor, in accordance with one embodiment of the present invention.

FIG. 2 shows a cross-sectional view of an exemplary structure including an exemplary FET in accordance with one embodiment of the present invention. Structure 200 includes FET 202, which is situated on substrate 204. FET 202 includes gate electrode layer 206, interfacial oxide layer 222, oxygen attracting layer 224, high-k dielectric layer 226, source 210, drain 212, and channel region 214. Similar to FET 102, FET 202 can be an NFET or a PFET. In one embodiment, FET 202 can be a MOSFET, such as an NMOS or PMOS transistor. In structure 200 in FIG. 2, substrate 204, gate electrode layer 206, source 210, drain 212, and channel region 214 correspond, respectively, to substrate 104, gate electrode layer 106, source 110, drain 112, and channel region 114 in structure 100.

As shown in FIG. 2, interfacial oxide layer 222 is situated over channel region 214 on top surface 220 of substrate 204. Interfacial oxide layer 222 can comprise a thin layer of silicon dioxide, which can be grown over substrate 204 by utilizing a thermal or plasma comprising nitrogen oxide, such as NO, $N_2O$, or $NO_2$, or oxygen. By way of example, interfacial oxide layer 222 can have a thickness of between approximately 4.0 Angstroms and approximately 5.0 Angstroms. Also shown in FIG. 2, oxygen-attracting layer 224 is situated over interfacial oxide layer 222 and can comprise a silicate, such as zirconium silicate or hafnium silicate. Oxygen-attracting layer 224 can be formed by depositing a metal layer comprising hafnium, zirconium, or other suitable metal over interfacial oxide layer 222 utilizing a CVD process or other appropriate processes. The metal in the metal layer attracts and combines with excessive oxygen from oxide layer 222 and high-k dielectric layer 226 to form a silicate, such as zirconium silicate or hafnium silicate, which is determined by the particular metal utilized to form the metal layer. For example, if hafnium were utilized to form the metal layer, the hafnium would combine with the excessive oxygen to form hafnium silicate. By way of example, oxygen-attracting layer 224 can have a thickness of approximately 5.0 Angstroms.

Also shown in FIG. 2, high-k dielectric layer 226 is situated over channel region 214 on top surface 220 of substrate 204. High-k dielectric layer 226 can be deposited over substrate 204 by utilizing a CVD process or other appropriate processes and can comprise hafnium oxide, hafnium silicate, zirconium oxide, or zirconium silicate. By way of example, high-k dielectric layer 226 can have a thickness of approximately 10.0. Further shown in FIG. 2, gate electrode layer 206 is situated over high-k dielectric layer 226 and is substantially similar in composition, thickness, and formation to gate electrode layer 106 in structure 100 in FIG. 1.

By growing a high-quality thin oxide layer, i.e. interfacial oxide layer 222, over substrate 204, the present invention prevents high-k elements, such as hafnium or zirconium, in high-k dielectric layer 226 and oxygen-attracting layer 224 from diffusing into channel region 214 in substrate 204. As a result, the present invention advantageously reduces carrier mobility degradation in channel region 214 of FET 202. Additionally, by forming oxygen-attracting layer 224 over interfacial oxide layer 222 to attract excessive oxygen from interfacial oxide layer 222 and high-k dielectric layer 226, the present invention prevents an undesirable increase in thickness of the interfacial oxide layer, i.e. interfacial oxide layer 222, of FET 202.

Figure 3:
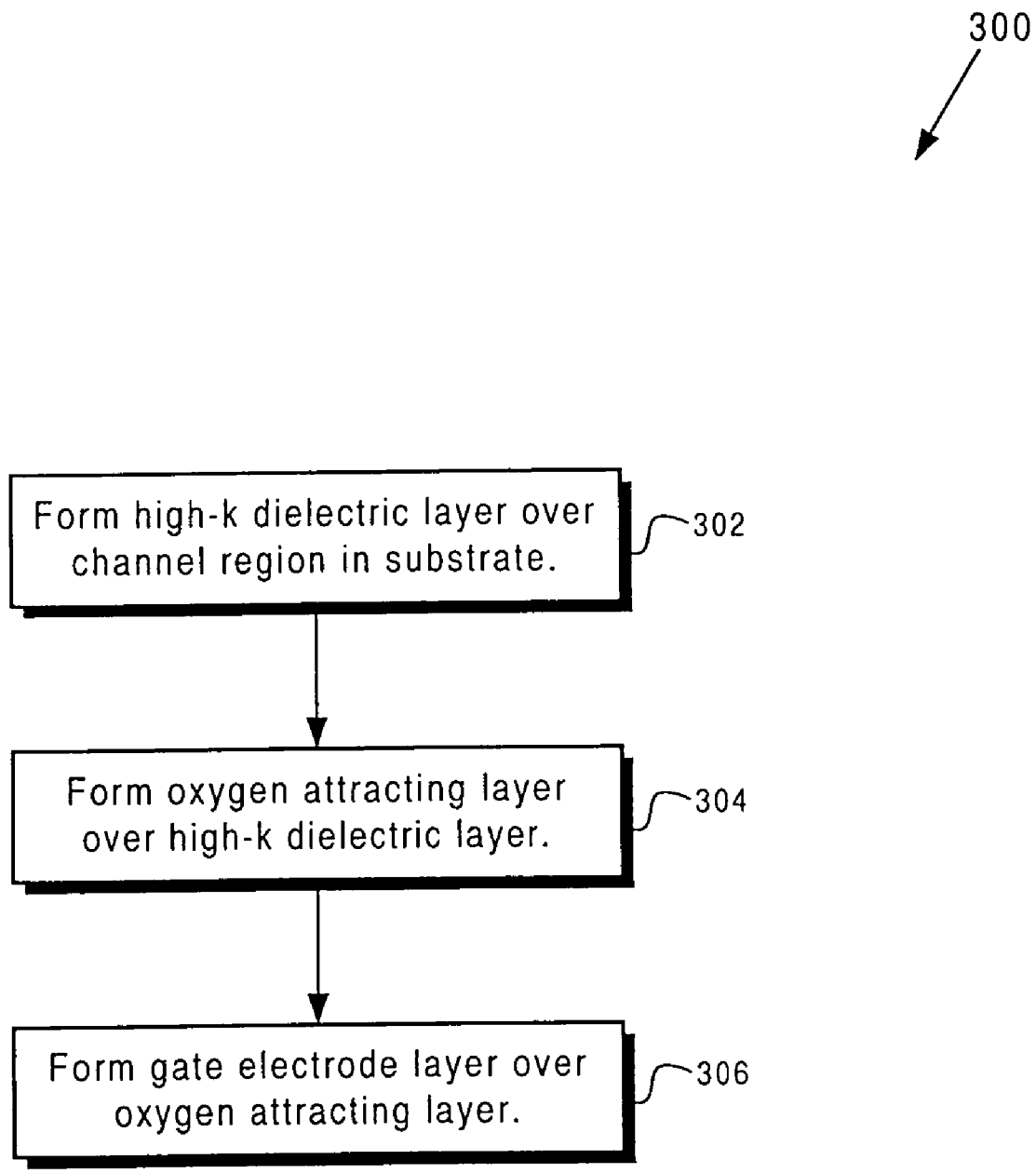
FIG. 3 is a flowchart corresponding to exemplary method steps according to one embodiment of the present invention.

Referring to FIG. 3, an example of a method by which FET 102 in structure 100 in FIG. 1 is fabricated is now discussed. Certain details and features have been left out of flowchart 300 that are apparent to a person of ordinary skill in the art. At step 302, high-k dielectric layer 116 is formed over channel region 114 in substrate 104, which is situated in a semiconductor wafer. For example, high-k dielectric layer 116 can be formed by utilizing a CVD process to deposit a high-k dielectric, such as hafnium oxide or zirconium oxide, over substrate 104. At step 304, oxygen-attracting layer 118 is formed over high-k dielectric layer 116. Oxygen-attracting layer 118 can be formed by, for example, utilizing a CVD process to deposit a layer of metal, such as hafnium or zirconium, over high-k dielectric layer 116. The layer of metal is converted into a high-k dielectric, such as hafnium oxide or zirconium oxide, by attracting and combining with excessive oxygen from high-k dielectric layer 116. At step 306, gate electrode layer 106 is formed over oxygen-attracting layer 118. For example, gate electrode layer 106 can be formed by utilizing a CVD process to deposit a layer of polycrystalline silicon over oxygen-attracting layer 118.

Figure 4:
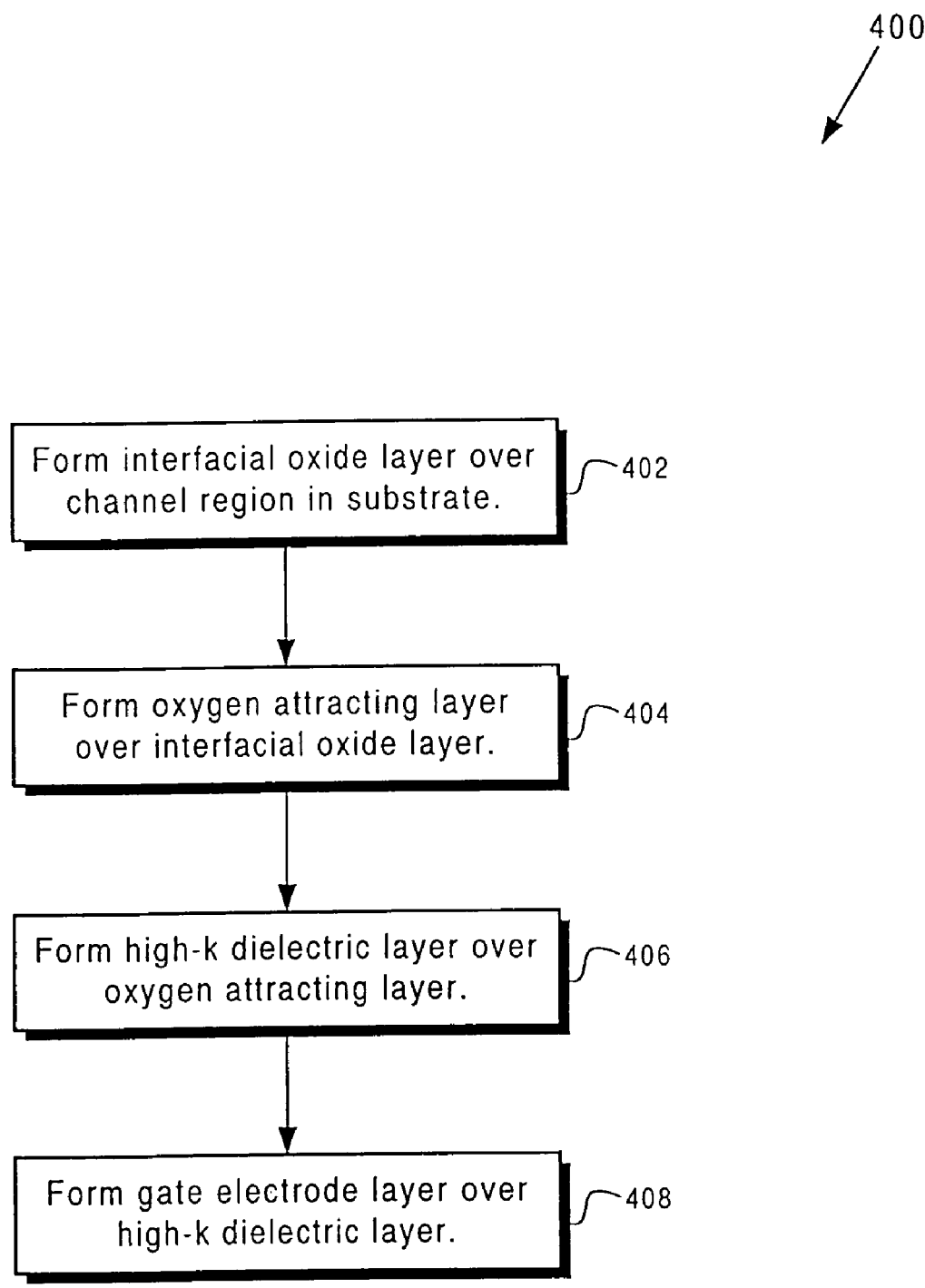
FIG. 4 is a flowchart corresponding to exemplary method steps according to one embodiment of the present invention.

Referring to FIG. 4, an example of a method by which FET 202 in structure 200 in FIG. 2 is fabricated is now discussed. Certain details and features have been left out of flowchart 400 that are apparent to a person of ordinary skill in the art. At step 402, interfacial oxide layer 222 is formed over channel region 214 in substrate 204. For example, interfacial oxide layer 222 can be formed by utilizing a thermal or plasma comprising nitrogen oxide, such as NO, $N_2O$, or $NO_2$, to grow a thin layer of silicon dioxide over substrate 204. At step 404, oxygen-attracting layer 224 is formed over interfacial oxide layer 222. For example, oxygen-attracting layer 224 can be formed by utilizing a CVD process to deposit a metal layer comprising hafnium or zirconium over interfacial oxide layer 222. The hafnium or zirconium in the metal layer then combines with excessive oxygen from interfacial oxide layer 222 and subsequently formed high-k dielectric layer 226 to form hafnium silicate or zirconium silicate, respectively. At step 406, high-k dielectric layer 226 is formed by utilizing, for example, a CVD process to deposit a high-k dielectric, such as hafnium oxide or zirconium oxide, over oxygen-attracting layer 224. At step 408, gate electrode layer 206 is formed over high-k dielectric layer 226. For example, gate electrode layer 206 can be formed by utilizing a CVD process to deposit a layer of polycrystalline silicon over high-k dielectric layer 226.

Thus, in an embodiment of the present invention shown in FIG. 1, the present invention utilizes an oxygen-attracting layer to prevent formation of an undesirable low-quality interfacial oxide layer. As a result, the present invention advantageously achieves a FET having a high-k gate dielectric stack, where the high-k gate dielectric stack has a desirably low EOT. In an embodiment of the present invention show in FIG. 2, the present invention achieves reduced carrier mobility degradation in a channel region of a FET by utilizing a high-quality interfacial layer to prevent a high-k element in a high-k dielectric layer from diffusing into the channel region. Additionally, in the embodiment shown in FIG. 2, the present invention utilizes an oxygen-attracting layer to attract excessive oxygen and, thus, to prevent an undesirable increase in thickness of an interfacial oxide layer.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, method for forming a field effect transistor having a high-k gate dielectric and related structure have been described.

What is claimed is:

1. A method for forming a field effect transistor over a substrate, said method comprising steps of:
   forming a high-k dielectric layer over a channel region of said substrate;
   forming an oxygen-attracting layer over said high-k dielectric layer;
   forming a gate electrode layer over said oxygen-attracting layer;
   wherein said oxygen-attracting layer prevents an interfacial oxide layer from forming between said high-k dielectric layer and said substrate.

2. The method of claim 1 wherein said step of forming said oxygen-attracting layer comprises forming a metal layer over said high-k dielectric layer, said metal layer combining with oxygen from said high-k dielectric layer to form a high-k dielectric.

3. The method of claim 1 wherein said oxygen-attracting layer and said high-k dielectric layer form a high-k gate dielectric stack.

4. The method of claim 1 wherein said oxygen-attracting layer is selected from the group consisting of zirconium oxide and hafnium oxide.

5. The method of claim 1 wherein said high-k dielectric layer is selected from the group consisting of zirconium oxide and hafnium oxide.

6. The method of claim 1 wherein said oxygen-attracting layer has a thickness of approximately 5.0 Angstroms.

7. The method of claim 1 wherein said high-k dielectric layer has a thickness of between approximately 20.0 Angstroms and approximately 30.0 Angstroms.

* * * * *